United States Patent [19]

Aitken

[11] Patent Number: 5,300,785
[45] Date of Patent: Apr. 5, 1994

[54] APPARATUS FOR AND METHOD OF PRODUCING ION BEAMS

[75] Inventor: Derek Aitken, Surbiton, England
[73] Assignee: Superion Limited, London, England
[21] Appl. No.: 852,209
[22] PCT Filed: Oct. 2, 1991
[86] PCT No.: PCT/GB91/01696
§ 371 Date: Jun. 4, 1992
§ 102(e) Date: Jun. 4, 1992
[87] PCT Pub. No.: WO92/06486
PCT Pub. Date: Apr. 16, 1992

[30] Foreign Application Priority Data
Oct. 4, 1990 [GB] United Kingdom ............ 9021629

[51] Int. Cl.$^5$ ............................................. H01J 37/26
[52] U.S. Cl. .............................. 250/492.2; 250/423 R; 250/424
[58] Field of Search ........... 250/492.2, 492.21, 423 R, 250/424; 313/360.1, 363.1

[56] References Cited

U.S. PATENT DOCUMENTS

| | | | |
|---|---|---|---|
| 3,770,870 | 11/1973 | Kervizic et al. | 250/425 |
| 4,151,420 | 4/1979 | Keller et al. | 250/492.21 |
| 4,578,589 | 3/1986 | Aitken | 250/492.21 |
| 4,914,305 | 4/1990 | Benveniste et al. | 250/492.21 |
| 4,994,164 | 2/1991 | Bernardet et al. | 204/298.41 |

FOREIGN PATENT DOCUMENTS
0307017 3/1989 European Pat. Off. .

OTHER PUBLICATIONS
Patent Abstract of Japan, vol. 11, No. 325 (E-551) (2772) 22 Oct. 1987 & JP, A, 62 113 346 (Toshiba Corp.) 25 May 1987.
Patent Abstract of Japan, vol. 13, No. 198 (E-756) (3546) 11 May 1989 & JP, A, 1 019 659 (Minolta Camera Co.) 23 Jan., 1989.
Patent Abstract of Japan, vol. 13, No. 396 (E-815 (3744) 4 Sep. 1989 & JP, A, 1 143 124 (JEOL Ltd.) 5 Jun. 1989.

*Primary Examiner*—Paul M. Dzierzynski
*Assistant Examiner*—Kiet T. Nguyen
*Attorney, Agent, or Firm*—Cushman, Darby & Cushman

[57] ABSTRACT

Apparatus (28) for implanting ions into a target element (26) comprising a circular array of hot cathode, arc discharge, ion sources (29) mounted on a rotary carousel (13) or a linear mechanism. An annular rotary support (15) around the carousel supports a plurality of extraction electrodes (18). A housing (20,23) defines an outlet path (32) for the ion beam from the ion source (29). The ion beam is directed through a beam analyzer (24) and through accelaration stages (25) to means (27) for scanning beam relative to the target (26) to be implanted. The carousel (13) and the annual support (15) can both be rotated, so as to bring into cooperating relationship required combinations of ion source (29) and extraction electrode (18).

21 Claims, 4 Drawing Sheets

APPARATUS FOR AND METHOD OF PRODUCING ION BEAMS

BACKGROUND OF THE INVENTION

The present invention relates to apparatus for and a method of producing a beam of ions for ion implantation in a target element. The invention relates in particularly but not exclusively to apparatus for and methods of implanting ions of a preselected species, into a target element, for example the controlled introduction of a species into the surface layer of another material. The technique is important in semi-conductor technology where it is used in the manufacture of integrated circuits and other devices, particularly by modifying the conductivity of semi-conductor material by introducing chemical impurities into the material. The general background to the use of ion implantation in the manufacture of large scale integrated circuit chips is set out in published U.S. Pat. No. 4578589, having the same inventor as the present application.

An ion implantation apparatus normally consists of an ion source, an extraction system having an extraction-electrode which accelerates the ions from the extraction slot in the ion source, an analysing magnet for the selection of the required ion species, acceleration stages before or after the analysing magnet, and a target region with means for producing relative scanning movement between the beam and the target, either by scanning the beam, or by moving the target.

A number of problems arise in connection with the ion source and extraction system, particularly where the ion implantation apparatus is to be used to implant a number of different species selectively in a target. The ion source is typically a hot cathode, arc discharge, with a tungsten filament, maintained at approximately $10^{-2}$ torr pressure by a gas or vapour supply system. Such an ion source has a limited operational life time before it requires servicing, and its performance and reliability are adversely affected by using the source for a number of different species. The extraction system is typically an accelerating gap with a voltage of 10–50 kV across it. Sparking across this gap often becomes a problem when the extraction conditions are changed, particularly when the species is changed or the extraction voltage increased.

SUMMARY OF THE PRESENT INVENTION

It is an object of the present invention to overcome or reduce these difficulties, and to provide apparatus for producing an ion beam, having an increased operational lifetime, and improved provision for changing from one species to another.

In accordance with the present invention, there is provided apparatus for producing a beam of ions, comprising a plurality of ion sources, moveable support means for supporting the ion sources, a housing defining an outlet path for an ion beam produced by an ion source, and drive means for moving the support means so as to bring a selected ion source into an operating position relative to the housing to direct an ion beam along the outlet path.

The invention has particular application in apparatus for implanting ions in a target element. Such apparatus in accordance with the invention comprises, as a component, an ion producing apparatus as set out in the previous paragraph, or as set out in succeeding paragraphs, together with means for accelerating, analysing and focusing the ion beam, and for directing the beam onto a target element.

The plurality of ion sources may be moveable in a number of different configurations, for example, a linear or rotary movement, but particular advantage may be obtained where the ion sources are provided in a circular configuration. Thus in one preferred form, the support means comprises rotary support means for supporting the ion sources in a circular configuration and the drive means comprises rotary drive means for rotating the support means to bring the selected ion source into the said operating position relative to the housing.

In accordance with a main preferred feature of the invention, the apparatus includes a plurality of extraction electrodes each for extracting ions from an ion source to produce an ion beam for ion implantation, second moveable support means for supporting the extraction electrodes and second drive means for moving the second support means so as to bring a selected extraction electrode into an operating position relative to the housing to extract an ion beam directed along the said outlet path.

The plurality of extraction electrodes may also be moveable in a number of different configurations. In one preferred arrangement the second support means comprises rotary support means for supporting the extraction electrodes in a circular configuration, and the second drive means comprises rotary drive means for rotating the second support means to bring the selected extraction electrode into the said operating position to extract the ion beam. Preferably the second support means supports the extraction electrodes in an annular configuration surrounding the ion sources, and also preferably the said configurations of the ion sources and the extraction electrodes lie in substantially the same plane and are concentric.

In another preferred arrangement, the second support means comprises a linear support means for supporting the extraction electrodes in a linear configuration, and the second drive means comprises a linear drive means for driving the second support means in a linear motion to bring the selected extraction electrode into the said operating position to extract the ion beam.

A convenient form of ion source which may be used is the Freeman or Bermas type. It is then convenient to arrange that the magnetic field required for the ion source is parallel to the rotational axis of the first rotary support means for the ion sources. In such a case, in one preferred arrangement the apparatus includes means for producing an ion source magnetic field parallel to the axis of rotation of the rotary support means for the ion sources, the annular field producing means being positioned coaxially with the rotary support means and the circular configuration of ion sources lying within the magnetic field. Such an arrangement is particularly convenient where the ion sources are supported on a rotary support means, and the extraction electrodes are supported on a linear moveable support means.

Preferably there is provided gas supply means for supplying gas to an ion source which is positioned in the said operating position, the gas supply means including a central manifold located at or in the region of the centre of the said circular configuration of the ion sources, and electrical power supply means for supplying voltage to an ion source which is positioned at the said operating position, the voltage supply means including central conductors located at or in the region of the centre of the said circular configuration of ion sources, and wiper means for transferring voltage from the central conductors to the ion source at the said operating position. Thus where a concentric arrangement of ion sources and extraction electrodes is provided, a single set of supplies, both electrical and gas, can be made, utilising annular manifolds and wipers to take supplies to the particular combination of ion source and extracting electrode which is in use.

The arrangement of multiple ion sources and extraction electrodes can be used to extend the operational life of such apparatus by an order of magnitude, and also allows the use of different arc chamber designs for the ion sources for different species to be implanted, within a single overall apparatus. Thus in accordance with preferred features of the invention, at least some of the ion sources are sources of ions of different species, and preferably at least some of the extraction electrodes are identified as being allocated for use with a particular species individual to that electrode. It can be arranged that at least some of the extraction electrodes are of different configurations, selected to be appropriate to particular species and implant conditions. It is a particularly advantageous feature of the invention, that control means may be provided for bringing into cooperating relationship predetermined combinations of extraction electrode and ion sources.

Advantages of the invention, at least in preferred forms thereof, are as follows. It is possible to produce an improved performance generally from the ion sources, by not mixing ion species in any individual ion source, such as an arc chamber. By allocating specific arc chambers to specific species, it is possible to use for each the optimum arc chamber design. Also it, is possible to obtain substantially spark-free extraction conditions rapidly after conditioning of the arc extractor, by the step of dedicating particular combinations of ion source and extraction electrode gaps to a particular set of extractions conditions, set for example by the species, energy, current and geometry to be used. Where such combinations are preselected and adhered to, there can be provided a capability for rapid changes of species by appropriate movements of the first and second moveable support means.

Next, there is an improvement of operating because the ion sources and extraction electrodes are subjected to less taxing operation, because of the avoidance of changing species and so on. Finally, the very provision of a plurality of ion sources, and a plurality of extraction electrodes, in itself leads to a long operational life between service requirements due to the number of interchangeable units which are available.

It is to be appreciated that features of the invention which have been set out with regard to apparatus of the invention, may also be provided in respect of methods according to the invention, and vice versa.

In particular there may be provided in accordance with the invention a method of implanting ions in a target element, including the steps of moving an array of ion sources so as to bring a selected ion source into an operating position relative to an outlet path defined by a housing for the ion sources, producing an ion beam from the selected ion source, and directing the ion beam along the said outlet path. Preferably the method includes the step of moving an array of extraction electrodes so as to bring a selected extraction electrode to an operating position relative to the outlet path and relative to the selected ion source, and operating the extraction electrode to extract from the selected ion source an ion beam directed along the outlet path. The invention has particular application where the method includes the step of moving the array of ion sources and the array of extraction electrodes, so as to bring into co-operating relationship predetermined combinations of extraction electrode and ion source.

BRIEF DESCRIPTION OF THE DRAWINGS

An embodiment of the invention will now be described by way of example with reference to the accompanying drawings in which:

FIG. 4b shows a diagrammatic cross sectional view of the apparatus of FIG. 4a, taken at the lines BB in FIG. 4a.

DESCRIPTION OF THE PREFERRED EMBODIMENT

Figure 1:
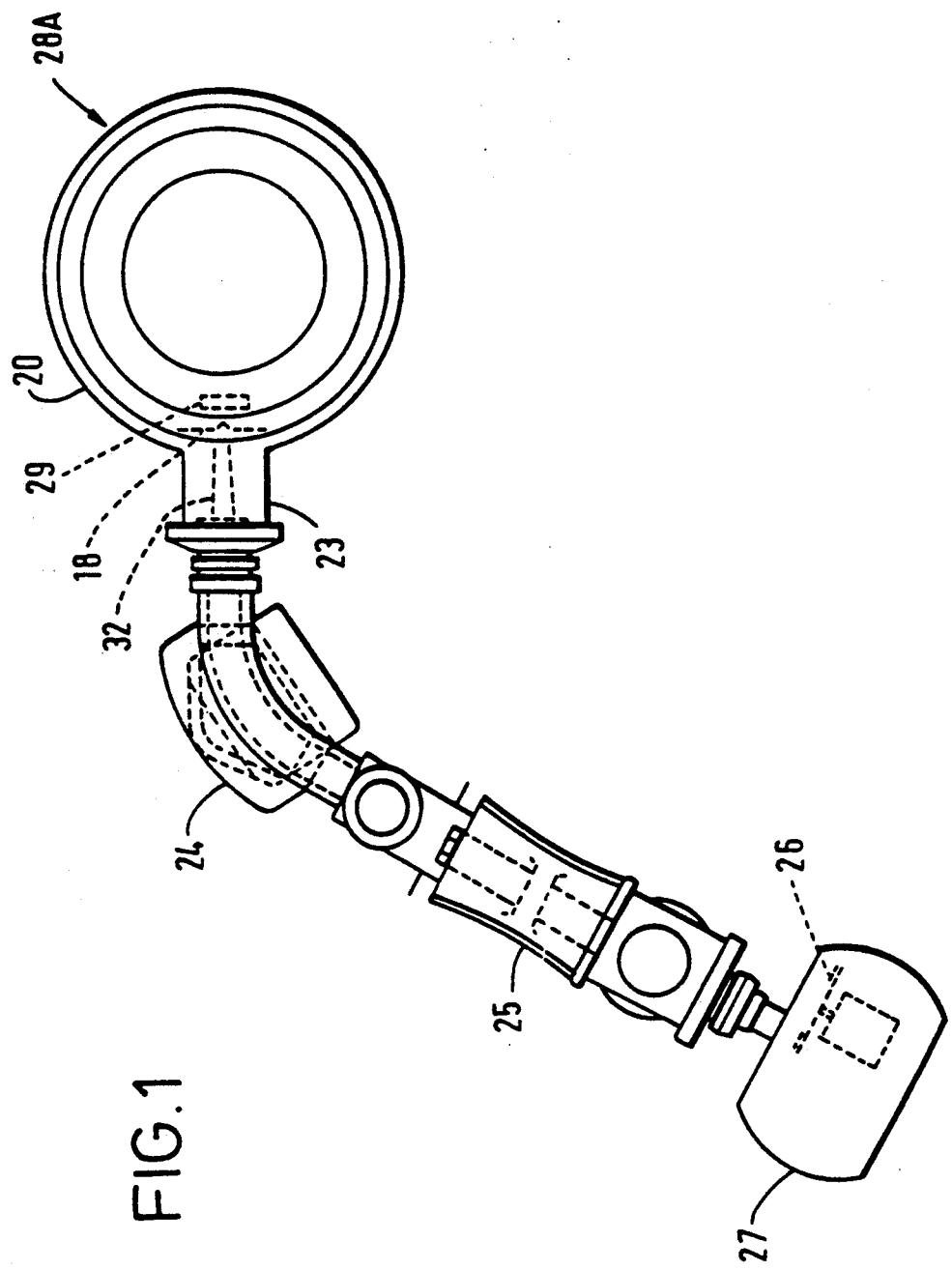
FIG. 1 is a diagrammatic plan view of an ion implantation apparatus embodying the present invention.

Referring to FIG. 1, an ion implantation apparatus comprises an ion source 29 aligned with an extraction electrode 18 within a vacuum chamber 20. A beam of ions for implantation emerges through a side port 23 along an outlet path 32 leading to an analysing magnet 24 for selection oil the required ion species for implantation. The ion beam leaving the analysing magnet 24 masses through various accelation stages indicated generally at 25 and impinges on a target element 26 such as a semi-conductor wafer within a target chamber 27. With the exception of the components within the vacuum chamber 20, the other components shown in FIG. 1 are known, and are described in more detail in, for example, an article by the present inventor entitled "The Design Philosophy for a 200 kV Industrial High Current Ion Implanter", Nuclear Instruments and Methods, Vol. 139, pp. 125-134 (1976).

The ion producing apparatus indicated generally at 28 in FIG. 1, will now be described in more detail with reference to FIGS. 2 and 3. The apparatus comprises a first rotary support means 13, referred to as a carousel, mounted for rotation on bearings (not shown) on a central supply tube 12, about an axis 28. Also mounted for rotation about the same axis 28, is a second rotary support means comprising an annular support ring 15. The ring 15 is also mounted for rotation about the central supply tube 12, on bearings not shown. The carousel 13, support ring 15, and components mounted thereon, are all housed in the vacuum chamber 20. The carousel 13 supports an array of ion sources 29 spaced in a circular configuration around the carousel 13. The support ring 15 supports an array of extraction electrodes 19, spaced in a circular configuration around the support ring 15. As will be described hereinafter, the carousel 13 and the support ring 15, are rotated to bring a selected pair of ion source and extraction electrode into alignment, in required operating positions. The various sources and extraction electrodes will not normally the same but will normally have the same basic components. These will now be described with reference to the selected pair shown in FIGS. 2 and 3.

The ion source 29 is, for example, a hot cathode, arc discharge device comprising a tungsten filament 2 mounted in an arc chamber 1 having an extraction slot 17 facing towards the extraction electrode 18. The arc chamber 1 is in communication with a vaporiser 7. The filament 2 is connected at both ends by flexible copper braid 3 to a vertical copper armature bar 4. At the inner end of the carousel 13, a rotor annulus 11 contains gas supply pipes 30 and on top of the rotor annulus 11 are various electrical conductors 31 providing an electrical supply to the vaporiser 7 and connection to conventional thermocouples for the vaporiser. The gas supply pipes 30 constitute a manifold formed in the rotor annulus 11 to be supplied centrally, and the conductors 4 and 31 provide a series of connections to be selectively energized by wiper means to be described hereinafter, and indicated generally at 40 in FIG. 3. Similarly, each of the plurality of extraction electrodes 18 distributed around the support ring 15 has an associated, conventional, ground potential electrode 19, and the electrodes 18,19 are supplied with voltage by a series of conductors and wipers, omitted for simplicity.

Turning now to the stationary components of the apparatus, the vacuum chamber 20 has a top flange 22 and a base flange 16. A glass or ceramic insulator tube 14 leads downwardly from the base flange 16 to sealing means (not shown) to provide a seal with the rotating components of the apparatus. At the central core of the apparatus, a stator flange 9 is mounted on top of the central supply pipe 12 and supports wipers 8 cooperating with the conductors 31. Also mounted on the central supply tube 12 are wipers 5 for passing the main filament current to the armature bars 4, and shields 6 behind the wipers 5. Leading up from the central supply tube 2 and downwardly through the stater flange 9, is a gas supply tube 10, cooperating with the manifold containing the gas supply pipes 30 for the arc chamber 1. The flange 16 (and other parts of the vacuum chamber) are protected from direct exposure to breakdown sparks by shields 21. These are at ground potential but are electrically isolated from the chamber so that the discharge current paths can be controlled. This is important if damage to electronic components is to be avoided.

By way of example, sixteen ion sources 29 may be positioned around the carousel. Taking a conservative lifetime of twelve hours for each ion source, this gives a total lifetime of eight days if one species is used, and a practical three species life time of approximately seven days. Suitably the ion sources are of the Freeman or Bernas types. These are suitable because they require a magnetic field parallel to the rotational axis of the carousel, which can be provided by an external magnet comprising source magnet poles 38 and source magnet coils 39. The arc chambers can therefore be placed close to each other with only heat shields between them.

Conveniently, up to eight extraction electrode assemblies can be supplied on the support ring 15. The electrodes which are not in use are kept well clear to minimise sparking between unused arc chambers and extraction electrodes. The rotation of the outer annular ring 15 is driven to give a coarse movement for selection of the required extraction electrodes and a fine movement, to give alignment of the extraction gap with the source, so that the extracted beam enters the analysing magnet at the correct position.

By way of example, the following dimensions, and operating parameters may be used. The extraction electrode support structure, and the vacuum chamber, are at beam line potential (not necessarily ground potential), while the ion source carousel is at the preanalysis acceleration potential (which determines the energy of the beam leaving the beam formation system). The latter potential is typically in the range 20–50 kV. The ion source carousel may be approximately 40 centimetres diameter, and the overall vacuum chamber 50 centimeters in diameter. The source filament may be a 2 mm diameter tungsten rod 150 mm long.

The following supplies may be made to an ion source 29 which is selected for operation:

| | |
|---|---|
| Filament supply | Typically 5 V, 160A DC. |
| Arc supply | This determines the potential of the filament relative to the arc chamber body, and is typically 30–200 V, 0.1–5A DC. |
| Vapouriser Supply | Phosphorus and arsenic elemental feed is a common requirement. This needs an oven with a 300–500° C. capability, say 40 V, 20A AC. |
| Gas supply | Typically at a pressure of 0.01–1 torr. BF$_3$ and argon are common requirements. |

The operation of the apparatus is as follows. Two electric motors indicated diagrammatically at 35 and 36, drive the carousel 13 and support ring 15, respectively, under electronic control by control means which allows the operator to bring a selected extraction electrode 18, and a selected ion source 29, into alignment along the outlet path indicated diagrammatically at 32. Once the extraction electrode and arc chamber have been selected and positioned, the ion implantation apparatus of FIG. 1 operates generally in known manner. The ion source source filament 2 generates an ion beam which is extracted by the electrode 13 and passed through the analysing magnet 24 and the acceleration stages 25 to impinge on the target 26 in the target chamber 27. Means are provided within the chamber 27 to produce relative scanning motion between the beam and the target, either by scanning the beam or by moving the target.

In operation, the source filament 12 is electrically isolated from the arc chamber 1 and held at the arc potential voltage. It is heated to thermionic emission temperature by the filament current. High current connections are made at each end and the flexible copper braid 3 carries the supply current to the filament from the copper amature bars 4. The wisers 5 may be of beryllium cooper or graphite, and make contact with both ends of the filament 2. There cannot be a common supply to one end of all the filaments around the carousel, because a short on the filament insulator of one arc chamber would then make all the arc chambers unusable. A large number of wiper contacts are used, e.g. twenty-four, in order to get reliable low resistance contact for the heating current, for example 160 amps. The surfaces of the amature bars are kept clean by the shields 6 which prevent line of sight condensation of phosphorus or arsenic vapor or sputtered material. The wipers for the vaporiser supply and the thermocouple contacts are shown diagrammatically at 8 and are mounted on the stator flange 9 together with the gas supply tube 10. The rotor annulus 11 carries armature plates for the vapouriser supply and thermocouple connection, indicated diagrammically at 31. The vaporiser 7 contains materials such as red phosphorus or metallic arsenic. The vapors of these elements can then be fed directly to the arc chamber, maintaining a pressure in the arc-chamber of approximately 0.01 torr.

The drive means for the extraction electrode support ring 15 indexes the support ring and allows the support ring and allows fine adjustment of the extraction electrode position to give the required precise alignment of the extraction electrode relative to the extraction slot 17 in the arc chamber.

The extraction electrode 18 is mounted on insulators (not shown) so that a potential of up to 20 kV (negative) can be maintained between the electrode and the support ring 15, conveniently at ground potential. The ground potential electrode 19 defines the limit of the bias field (up to 20 kV) which prevents electrons backstreaming into the ion source. Both electrodes can be moved together in a radial direction relative to the support ring, so that the extraction gap (the distance between the extraction electrode and the arc chamber) is large in the seven positions not being used, and is the required operating extraction gap only for the combination of extraction electrode and ion which is selected for operation.

There will now be described with reference to FIGS. 4a and 4b a modification of the apparatus of the previous Figures. The arrangement shown in FIGS. 1 to 3, where both the ion sources and the extraction electrodes are mounted on rotary supports, is particularly suitable where large numbers of arc chambers (for example twelve or more) are used, and is particularly advantageous when very long periods of continuous operation and a wide range of extraction conditions are required. If a smaller number of combinations of extraction electrode and ion source are to be used, or if space does not permit the relatively large carousel arrangement to be retrofitted to existing ion implantation machines, then a modified design may be used as shown in FIGS. 4a and 4b. The arrangement of the previous figures does not scale to a smaller size conveniently because a conflict develops between the central preaccelerator insulator and the source magnet.

The solution adopted in the arrangement of FIGS. 4a and 4b is to use a hollow source-magnet pole structure, to place the entire assembly of ion sources within the source-magnet pole structure, and to mount a smaller number of electrodes on a linear moveable support member instead of the outer rotary support member shown in the previous embodiment. This leads to an extremely compact design.

Figure 2:
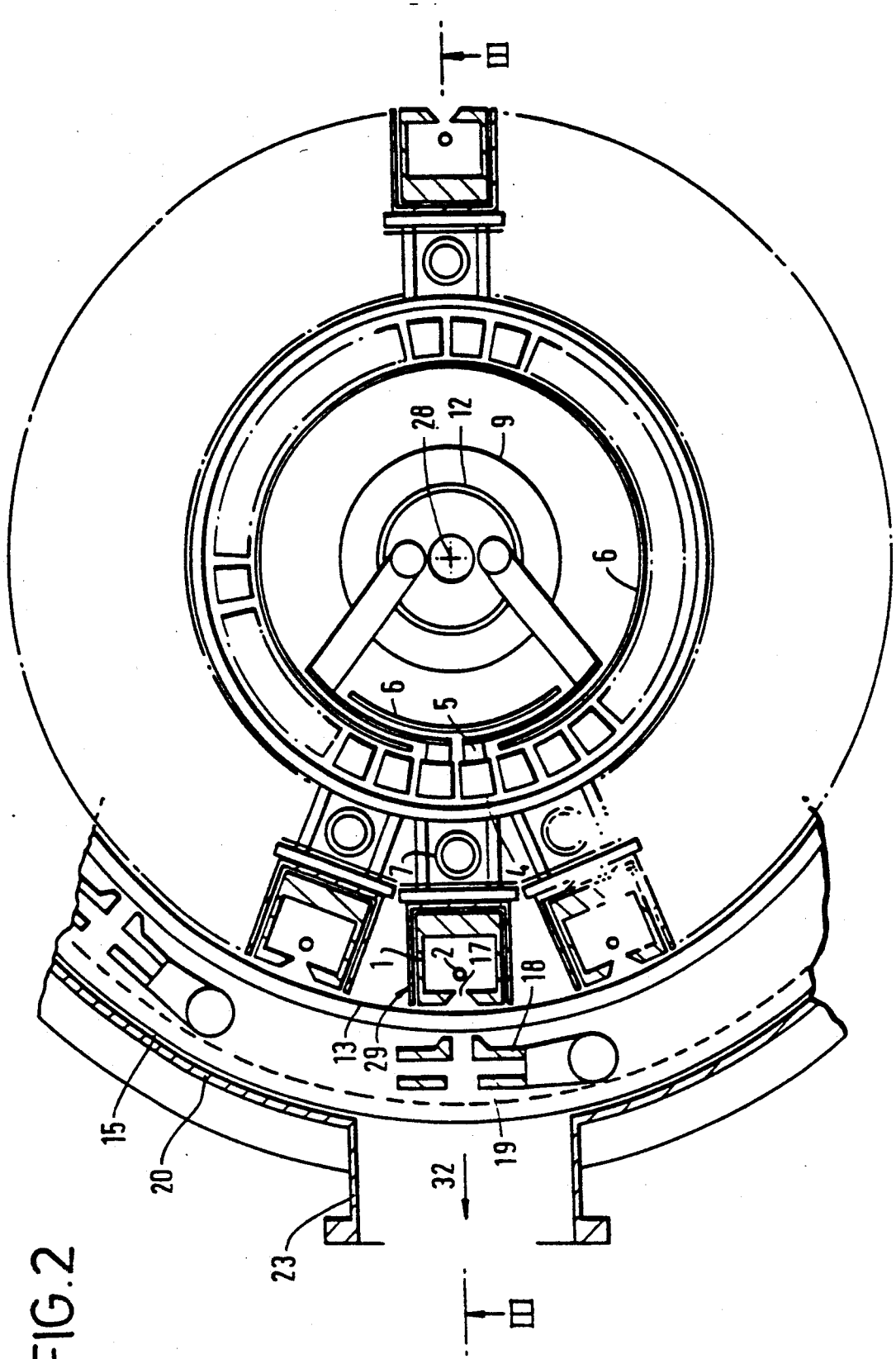
FIG. 2 is a diagrammatic plan view of apparatus for producing an ion beam for use in ion implantation, and illustrates an ion beam producing apparatus which is used in the apparatus of FIG. 1.
Figure 3:
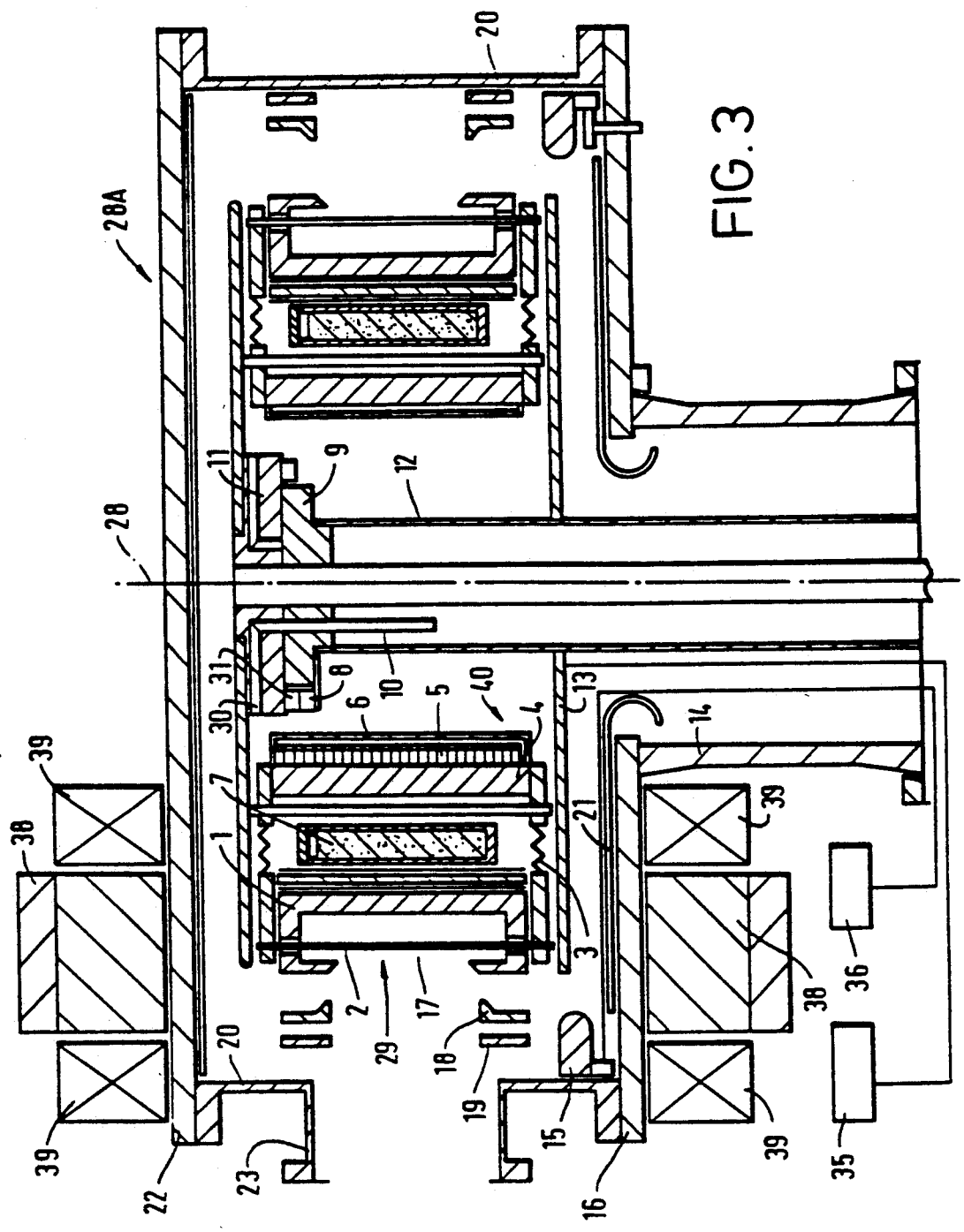
FIG. 3 is a diagrammatic cross-section along the lines III—III in FIG. 2.
Figure 4A:
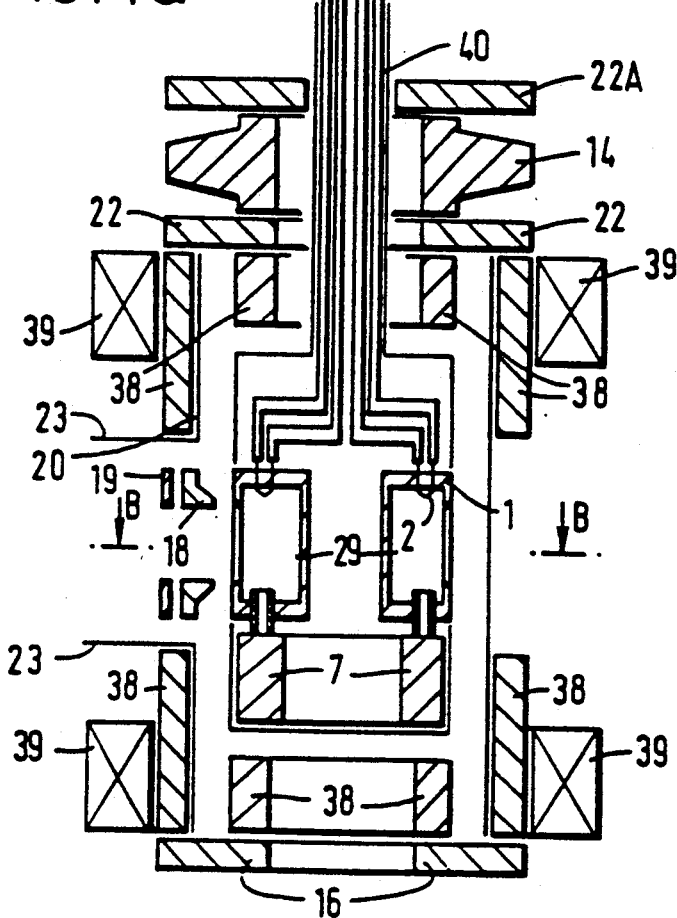
FIG. 4a shows in side section a diagrammatic representation of a modification of the ion implantation apparatus of FIG. 1, embodying the invention.
Figure 4B:
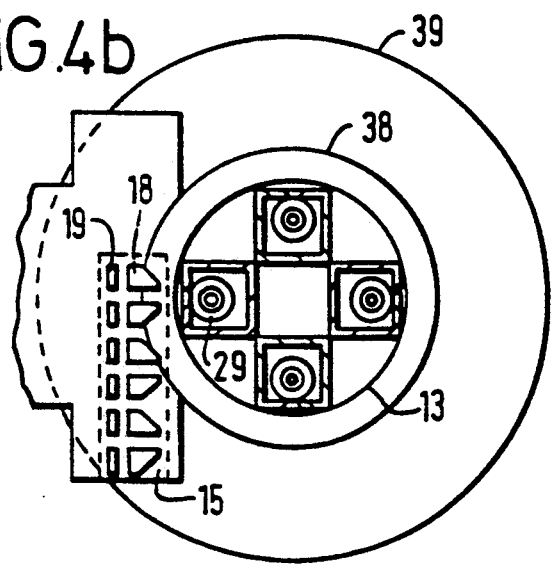

Referring now to FIG. 4a and 4b, components which correspond to components in the previous FIGS. 1 to 3 will be indicated by like reference numerals. The representation of FIGS. 4a and 4b is simplified, and some components which correspond to the previous embodiment have been omitted for simplicity. Four ion sources 29 are mounted on a first rotary support means 13 and are supplied by electrical supply means 40 positioned coaxially with the axis of the rotary support means 13. Three extraction electrodes 18, are positioned on a linear moveable support means 15 which is moveable to bring a selected extraction electrode 18 into operating relationship with a selected ion source 29. It will be appreciated that more electrodes and sources may be provided, for example up to say eight ion sources 29 and up to say 4 extraction electrodes may be provided.

The magnetic circuit consists of a main annular outer pole 38 surrounded by magnet coils 39. The flanges 22 and 16 at the top and bottom of the vacuum chamber are made of magnetic material (or backed with magnetic material) and are connected by a return circuit which is not shown in the diagram. Inner annular poles 38 are provided for field shaping so that the magnetic field geometry in the arc chamber is as required. The source-magnet coils 39 and source-magnet poles 38 are arranged to surround the entire source chamber. It will be appreciated that this arrangement of source-magnet may also be provided where extraction electrodes are mounted on a rotary support means in place of the linear support means shown in FIGS. 4a and 4b.

The rotating ion source assembly 29, 13, is supplied by electrically supply means indicated generally at 40. For small numbers of arc chambers, individual supplies can be used; for larger numbers, a commutator system as in the embodiment of FIGS. 1 to 3 for the the carousel source may be more appropriate, with the wiper system in vacuum or in air. The source insulator 14 can either be an integral part of the source assembly, or can be a fixed source chamber component.

The geometry shown allows the source assembly to be of small diameter, but imposes no significant constraint on the length of the system. This is ideal for a Bernas source, with all the bulky high current conductors at the top end of the arc chamber. The space below the arc chambers is used for the vaporisers 7. A further top flange 22A, above the insulator 14 may house the rotating seal, the indexing system and the commutator assembly, if used.

I claim:
1. Apparatus for producing a beam of ions comprising:
   a plurality of ion sources;
   first moveable support means for supporting the ion sources;
   a housing defining an outlet path for an ion beam produced by an ion source;
   first drive means for moving the support means so as to bring a selected ion source into an operating position relative to the housing to direct said ion beam along the outlet path;
   a plurality of extraction electrodes each for extracting said ions from said ion source to produce said ion beam for ion implantation;
   second moveable support means for supporting the extraction electrodes; and
   second drive means for moving the second support means so as to bring a selected extraction electrode into an operating position relative to the housing to extract said ion beam directed along the said outlet path.

2. Apparatus according to claim 1 in which the first support means comprises rotary support means for supporting the ion sources in a circular configuration and the first drive means comprises rotary drive means for rotating the support means to bring the selected ion source into the said operating position relative to the housing.

3. Apparatus according to claim 2, including means for producing an ion source magnetic field parallel to the axis of rotation of the rotary support means for the ion sources, the annular field producing means being positioned coaxially with the rotary support means and the circular configuration of ion sources lying within the annular magnetic pole structure.

4. Apparatus according to claim 2, including gas supply means for supplying gas to an ion source which is positioned in the said operating position, the gas supply means including a central manifold located at or in the region of the centre of the said circular configuration of the ion sources.

5. Apparatus according to claim 2, including voltage supply means for supplying electrical power to an ion source which is positioned at the said operating position, the voltage supply means including central conductors located at or in the region of the centre of the said circular configuration of ion sources, and wiper means for transferring voltage from the central conductors to the ion source at the said operation position.

6. Apparatus according to claim 1, in which the second support means comprises rotary support means for supporting the extraction electrodes in a circular configuration, and the second drive means comprises rotary drive means for rotating the second support means to bring the selected extraction electrode into the said operating position to extract the ion beam.

7. Apparatus according to claim 6 in which the second support means supports the extraction electrodes in an annular configuration surrounding the ion sources.

8. Apparatus according to claim 7, in which the said configurations of the ion sources and the extraction electrodes lie in substantially the same plane and are concentric.

9. Apparatus according to claim 1, in which the second support means comprises a linear support means for supporting the extraction electrodes in a linear configuration, and the second drive means comprises a linear drive means for driving the second support means in a linear motion to bring the selected extraction electrode into the said operating position to extract the ion beam.

10. Apparatus according to claim 1 in which at least some of the ion sources are sources of ions of different species.

11. Apparatus according to claim 1 in which at least some of the extraction electrodes are identified as being allocated for use with a particular species individual to that electrode.

12. Apparatus according to claim 1 in which at least some of the extraction electrodes are of different configurations.

13. Apparatus according to claim 1 including control means for bringing into cooperating relationship predetermined combinations of extraction electrode and ion source.

14. Apparatus for implanting ions in a target element comprising an ion producing apparatus according to claim 1 together with means for accelerating, analysing and focusing the ion beam, and directing the beam onto a target element.

15. Apparatus for producing a beam of ions comprising:
 a plurality of ion sources;
 moveable support means for supporting the ion sources in a circular configuration;
 a housing defining an outlet path for an ion beam produced by an ion source, the outlet path lying in substantially the same plane as the circular configuration of ion sources, and being directed outwardly from the circular configuration of ion sources; and
 rotary drive means for rotating the support means so as to bring a selected ion source into an operating position relative to the housing to direct an ion beam along the outlet path in the said plane of the circular configuration of ion sources.

16. Apparatus according to claim 15, including means for producing an ion source magnetic field parallel to the axis of rotation of the rotary support means for the ion sources, the annular field producing means being positioned coaxially with the rotary support means and the circular configuration of ion sources lying within the annular magnetic pole structure.

17. Apparatus according to claim 15, including gas supply means for supplying gas to an ion source which is positioned in the said operating position, the gas supply means including a central manifold located at or in the region of the centre of the said circular configuration of the ion sources.

18. Apparatus according to claim 15, including voltage supply means for supplying electrical power to an ion source which is positioned at the said operating position, the voltage supply means including central conductors located at or in the region of the centre of the said circular configuration of ion sources, and wiper means for transferring voltage from the central conductors to the ion source at the said operating position.

19. A method of implanting ions in a target element including the step of:
 moving an array of ion sources so as to bring a selected ion source into an operating position relative to an outlet path defined by a housing for the ion sources;
 moving an array of extraction electrodes so as to bring a selected extraction electrode to an operating position relative to the outlet path and relative to the selected ion source;
 producing ions from the selected ion source, and operating the extraction electrode to extract an ion beam from the selected ion source; and
 directing the ion beam along the said outlet path to impinge on the target element.

20. A method according to claim 19, including moving the array of ion sources and the array of extraction electrodes so as to bring into co-operating relationship predetermined combinations of extraction electrode and ion source.

21. A method according to claim 19 in which the step of moving the array of ion sources comprises rotating the array of ion sources in a circular configuration, and the step of moving the array of extraction electrodes comprises rotating the plurality of extraction electrodes in an annular configuration surrounding the ion sources, the said configurations of the ion sources and the extraction electrodes lying in substantially the same plane and being concentric.

* * * * *